May 21, 1974 N. J. CLECAK ET AL 3,812,162
AZIDES
Original Filed Sept. 29, 1970
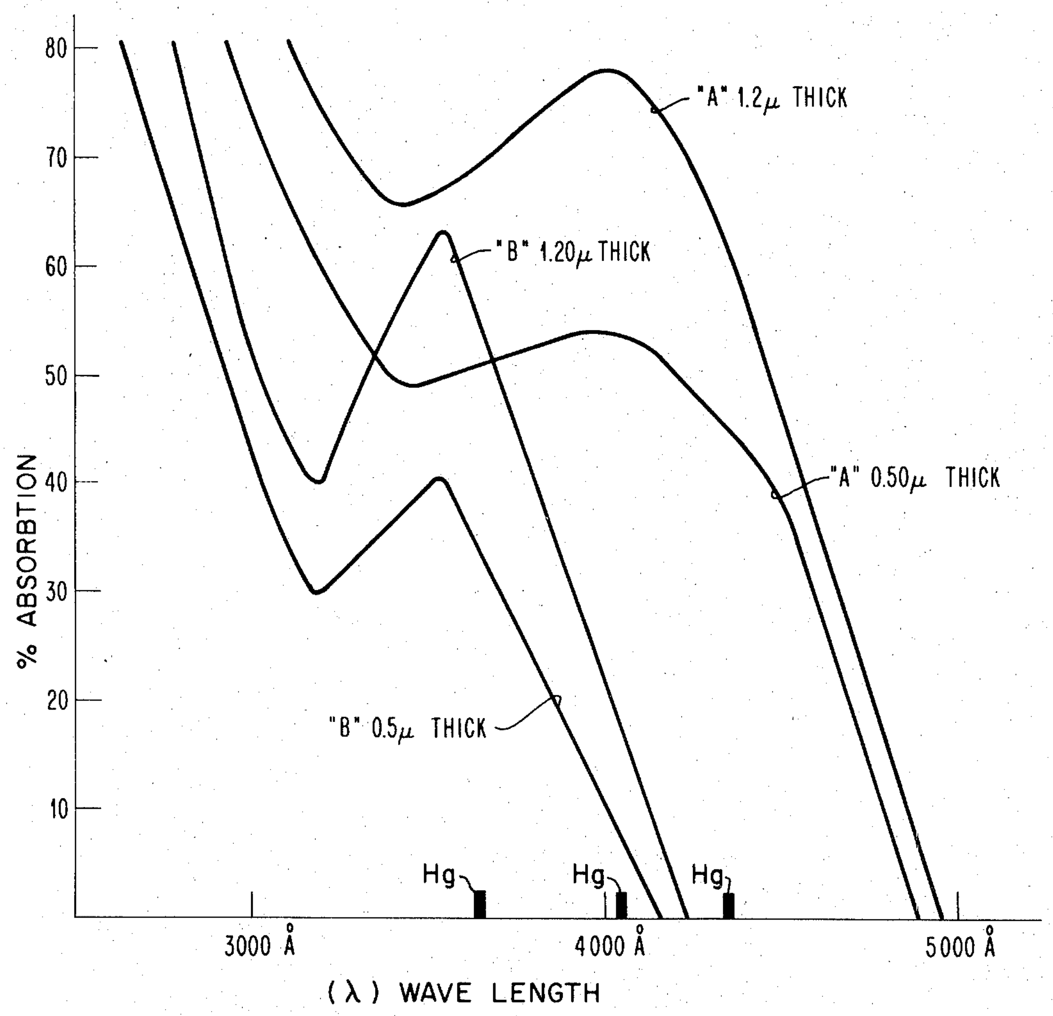

United States Patent Office 3,812,162

Patented May 21, 1974

3,812,162

AZIDES

Nicholas J. Clecak, San Jose, and Robert J. Cox, Los Gatos, Calif., and Wayne M. Moreau, Wappingers Falls, N.Y., assignors to International Business Machines Corporation, Armonk, N.Y.

Original application Sept. 29, 1970, Ser. No. 76,398, now Patent No. 3,695,886. Divided and this application May 15, 1972, Ser. No. 253,651

Int. Cl. C07c *117/00*

U.S. Cl. 260—349 4 Claims

ABSTRACT OF THE DISCLOSURE

Light sensitive photoresist compositions particularly useful for projection exposure applications include a photocrosslinkable polymer and novel sensitizers which are bis-p-azido cinnamylidene derivatives of cyclic and linear ketones.

RELATED INVENTION

This is a division of application Ser. No. 76,398, filed Sept. 29, 1970, now U.S. Pat. 3,695,886.

BACKGROUND OF THE INVENTION

This invention relates generally to photocrosslinkable polymer compositions and particularly to sensitizers for such compositions which are bis-p-azidocinnamylidene derivatives of cyclic and linear ketones.

In the manufacture of miniaturized electrical components it is necessary to form intricate patterns of materials with great dimensional accuracy. In a conventional pattern forming process the substrate layer is coated with a light sensitive composition, or photoresist, which is exposed to a light image. The solubility characteristics of the resist are changed by the exposure and a relief image is formed by removing, with a suitable solvent, either the exposed or the unexposed portions of the resist depending upon whether a positive or negative resist is employed. The remaining resist masks portions of the substrate and the exposed portions can then be treated to form the desired circuit patterns and components as by etching, coating, impregnation or other techniques which are well known in the art.

Generally, a contact printing technique is used to expose the resist wherein a printing mask is placed in contact with the resist layer and the layer exposed to actinic radiation through the open portions of the mask. The mask used to form the intricate patterns are expensive to manufacture and must be reused many times. A disadvantage of the contacting printing process is that contact between the mask and substrate can result in either physical damage to the delicate patterns on the mask or the physical transfer of resist to the mask. In any event, the contact results in gradual wear or deterioration of the mask so that it becomes unusable. It would be desirable, therefore, to employ a non-contact or a projection printing process, to avoid mask damage. Practical lens systems for projection exposure are relatively opaque to ultraviolet radiation. Unfortunately, the most photoresist compositions having the required speed for practical use are only sensitive in the shorter wavelengths and thus require actinic radiation in the ultra-violet range. For example, polymers sensitized with bis-p-azidobenzylidene ketones such as those described in Sagura et al. Pat. 2,940,853 have little or no absorption at about 4000 A. at film thicknesses below two microns.

BRIEF DESCRIPTION OF THE INVENTION

We have now discovered a new class of azide derivatives of cyclic and linear ketones which in combination with light sensitive polymers give thin film resist compositions having very fast speeds and an extended range of sensitivity making the compositions suitable for projection printing using conventional lens systems.

In accordance with this invention a light sensitive material is provided comprising a photo-crosslinkable polymer and a bis-p-azidocinnamylidene ketone. Preferred ketones have the general formula:

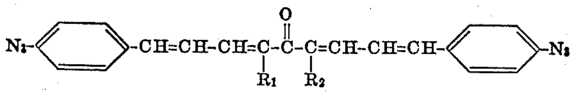

where $R_1$ is hydrogen or alkyl, where $R_2$ is hydrogen or alkyl, and where $R_1$ and $R_2$ may be joined to form a cyclic, aliphatic ketone having 4 to 6 carbon atoms in the ring.

DESCRIPTION OF THE DRAWINGS

The Figure is a graph of wavelength versus percent absorption of a composition of the invention compared with a light sensitive composition of the prior art.

DETAILED DESCRIPTION

Photo-cross-linkable polymers of the type useful in resist compositions of the invention are well known to those skilled in the art and include for example cyclized polyisoprene, polyvinylpyrrolidone, polyvinylcinnamate, poly(vinylcinnamylidene acetate), isopropyl polystyrene, polybutadiene, polyisobutylene, polysiloxane, etc.

The novel sensitizers of the invention are bis-p-azidocinnamylidene ketones. Preferred ketones have the general formula:

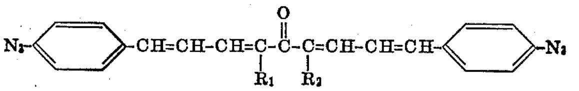

where $R_1$ is hydrogen or alkyl, where $R_2$ is hydrogen or alkyl, and where $R_1$ and $R_2$ may be joined to form a cyclic aliphatic ketone having 4 to 6 carbon atoms in the ring. It should be understood that the scope of the invention includes closely related compounds such as carbonyl azido cinnamylidene and sulfonyl azido cinnamylidene derivatives.

Representative compounds of the invention include, for example, 2,6-bis(p-azidocinnamylidene) 4-methyl cyclohexanone; 2,6-bis(p-azidocinnamylidene) cyclohexanone; 1,9-bis(p-azidophenyl) 1,3,6,8-nonatetraene-5-one.

The sensitizers of the invention are employed by mixing them with a light sensitive polymer in a suitable organic or aqueous-solvent system. Alternatively, it is possible to graft the ketones onto a suitable polymer chain to provide a self-contained light sensitive polymer resist.

Relative proportions of polymer and sensitizer may be varied as conditions require but generally the sensitizer will be present in approximately from one to twenty percent by weight based on the weight of polymer with the preferred range being one to ten percent. The solids content of the polymer-sensitizer solution will range from about one to forty percent by weight. Typical solvents include the lower alcohols such as methanol, ethanol, propanol; ketones such as cyclohexanone, 2-butanone, acetone; dimethylformamide, tetrahydrofuran, pyridine, benzene, toluene, etc. and mixtures thereof.

Conventionally, the film forming photosensitive compositions are coated on the substrate by any of the conventional methods well known in the photoresist art which can include dipping, spraying, spin coating and so forth. After application of the coating the solvent is driven off as by evaporation, to leave a thin coating of the photosensitive composition on the support. The coating may then be exposed imagewise to radiation through an ordinary lens projection system passing through a suitable mask or other conventional means wherein the light struck portions of the dry resist pattern will become insolubilized by radiation in the range above about 4000 A. The film thicknesses at which the insolubilization will occur using exposing radiation of wavelengths of 4000 A. or above can be as low as .3 micron. Thicker film can be used to a point beyond which the desired resolution is not obtained. For a 2.5 micron line width an optimum resist thickness is about .5 micron.

After the exposure induces photopolymerization or insolubilization of the coating in the exposed areas, the image is developed by treating the coating with a suitable solvent which removes the non-light struck areas of the coating. Conventional pre- and post-baking steps can be employed in order to enhance the resolution of the exposed areas.

The novel compositions of the invention can be prepared by reacting the corresponding cinnamaldehyde with the ketone. The p-azidocinnamaldehydes can be prepared by diazotization of 4-aminobenzaldehyde followed by treatment with sodium azide. For example, by the process described by M. L. Forrester and H. M. Judd, JCS, *97*, p. 254 (1910), the p-azidobenzaldehyde is then reacted with acetaldehyde to form the p-azidocinnamaldehyde which is then reacted with the desired ketone, for example, cyclohexanone to obtain a cyclic ketone derivative or with acetone to obtain a straight chain derivative.

The invention is further illustrated but is not intended to be limited by the following examples wherein parts are parts by weight unless otherwise indicated.

EXAMPLE 1

Preparation of 2,6-bis(p-azidocinnamylidene)4-methylcyclohexanone

In a round bottom flask equipped with a stirrer, condenser and thermometer, 20 grams of p-azidobenzaldehyde and 32 grams of acetaldehyde were slurried together. Keeping the reaction mixture at about 0° C. there was added stepwise 2 milliliters of a 20% solution of potassium hydroxide in methanol. After stirring for one hour, sixty-four milliliters of acetic anhydride were added and the reaction mixture was heated on a steam bath for one hour. The reaction mixture was then poured into a solution of 64 ml. of concentrated hydrochloric acid in 480 ml. of hot water, and the stirring and steam heating continued for an additional 15 minutes. After cooling, the reaction mixture was ether extracted, the ether extract washed with sodium acetate solution, and dried over sodium sulfate. The ether was evaporated and the oil that remained recrystallized from ether by cooling in a "$CO_2$-acetone" bath.

The resultant yellow crystals of p-azidocinnamaldehyde melted at 71–73° C. The structure was confirmed by nuclear magnetic resonance spectrometry and the purity determined thin layer chromotography and by elemental analysis. The p-azidocinnamaldehyde obtained in this manner weighed 6 grams. Calculated for $C_9H_7N_3O$: C, 62.42; H, 4.07; N, 24.27. Found: C, 62.24; H, 4.02; N, 24.22.

A solution of 0.6 grams of 4-methylcyclohexanone, 2.0 grams of the p-azidocinnamaldehyde prepared above and about 0.5 ml. of a 25% by weight aqueous sodium hydroxide in 75 ml. of ethanol was stirred in a round bottom flask at room temperature for 3½ hours. The reaction mixture was then filtered and the precipitate collected. The orange-yellow solid was recrystallized from acetic acid, and weighed 0.9 grams. NMR spectrometry proved the structure to be 2,6 bis(p-azidocinnamylidene) 4-methylcyclohexanone and thin layer chromatography and elemental analysis determined it to be pure. Found: Carbon, 71.08; hydrogen, 5.26; nitrogen, 19.70. Calculated for $C_{25}H_{22}N_6O$; Carbon, 71.07; hydrogen, 5.24; nitrogen, 19.89.

EXAMPLE 2

Preparation of 2,6-bis(p-azidocinnamylidene) cyclohexanone

This compound was prepared by an analogous method to the method used in Example 1. The formulation used in the final condensation was:

| | | |
|---|---|---|
| Cyclohexanone | grams | 0.6 |
| 4-azidocinnamylaldehyde | do | 2.0 |
| Ethanol | ml | 75 |
| 25% aqueous sodium hydroxide | ml | 0.5 |

The reaction was carried out in the same manner except that the compound was recrystallized from a mixture of toluelene and 30–60 petroleum ether. The product, which was shown to have the correct structure by NMR, was determined to be pure by thin layer chromatography and elemental analysis. Calculated for $C_{24}H_{20}N_6O$: Carbon, 70.57; hydrogen, 4.93; nitrogen, 20.57. Found: Carbon, 70.29; hydrogen, 4.71; nitrogen, 20.50.

EXAMPLE 3

Preparation of 1,9-bis(p-azidophenyl) 1,3,6,8-nonatetraene-5-one

The compound was prepared by a method analogous to the method of Example 1 with the following reagents being employed in the final condensation:

| | | |
|---|---|---|
| p-Azidocinnamaldehyde | grams | 2 |
| Actone | do | 0.4 |
| Ethanol | ml | 50 |
| Sodium hydroxide in 3 ml. of water | grams | 0.16 |

The reaction was carried out at room temperature for 4 hours. The precipitate was filtered, water washed and dried. It weighed 0.85 grams and was shown to have the correct structure by NMR. Purity was established by thin layer chromatography and elemental analysis. The compound decomposed on heating at 136° C. Calculated for $C_{21}H_{16}N_6O$: Carbon, 68.47; hydrogen, 4.37; nitrogen, 22.81. Found: Carbon, 68.49; hydrogen, 4.24; nitrogen, 22.31.

EXAMPLE 4

In order to illustrate the improved speed and spectral response of photoresist compositions containing the novel photosensitizing compositions of the invention, formulations of a negative photoresist were prepared. A photoresist composition A was prepared by dissolving 10 grams of cyclized poly-cis-isoprene (Goodyear NR) and 0.15 grams of 2,6 bis(p-azidocinnamylidene) 4-methylcyclohexanone in 80 ml. of xylene. A second resist formulation B according to the prior art contained about 27% by weight of liquid resist of cyclized poly-cis-isoprene and 1.7% by weight of liquid resist of 2,6 bis(p-azidobenzylidene)-4-methyl-cyclohexane dissolved in 100 ml. of a solvent mixture consisting of about 5% methyl cellulose, 12% benezne, and 82% xylene.

Each solution was coated to solid thicknesses of 0.5 microns and 1.2 microns on thermally oxidized silicon wafers (5 samples of each resist at each thickness) and the sensitivity of the resists determined at various wavelengths. The sensitometric procedure and equipment employed were similar to those described by M. Htoo in the Journal of Photographic Science and Engineering, vol. 12, No. 3, pp. 169–174, May-June 1968. The shutter was modified by replacement with an Ilex guillotine shutter to allow increments of time exposure to be made on each wafer.

The coated wafers were prebaked at 95° C. for 5 minutes, exposed for a series of time (2–10 seconds) with one sample of each lot being used to find the minimum time of exposure to obtain an image, developed for two minutes in xylene, and etched in HF to test the adhesion and etch resistance of the resist. The intensities of the exposure wavelengths were measured with a calibrated thermopile.

The speed or sensitivity of each lot was calculated from the minimum exposure energy found which is defined as the amount of energy (intensity×time=ergs/cm.$^2$) necessary to produce a good quality image which can withstand the HF etch. The speed or sensitivity is defined as the reciprocal of energy, times an arbitrary constant K; or $S=K/\text{energy}=K/\text{ergs/cm.}^2$, where K is chosen as $10^7$ to keep the values in small round numbers.

The results are shown in Table I below:

TABLE I

| Resist | Thickness, microns | Sensitivity $10^7$/ergs/centimeter$^2$ | | |
|---|---|---|---|---|
| | | 3650 A. | 4050 A. | 4350 A. |
| A | 0.5 | 1,430 | 1,000 | 420 |
| A | 1.2 | 1,250 | 950 | 390 |
| B | 0.5 | 164 | 95 | 6.5 |
| B | 1.2 | 156 | 90 | 21 |

As shown from the results listed in Table I the composition A of the invention gave approximately a 10 fold speed increase over the composition B of the prior art at the resist thicknesses shown which are needed for fine resolution and the composition showed sufficient sensitivity in the 4000 A. to 4350 A. wavelength range to make it extremely useful for projection printing. Because of the multiple exposures needed for projection printing the speed increase results in a vast reduction in throughput time. The drawing shows the absorption of compositions A and B as measured on a Beckman DK-2 spectrometer.

EXAMPLE 5

A resist composition was prepared by dissolving 10.0 grams of polyvinyl pyrrolidone (molecular weight about 100,000, GAF) 0.1 gram of 2,6-bis(p-azidocinnamylidene) 4-methylcyclohexanone in 100 ml. of methylcellulose acetate. The composition was coated on a silicon wafersubstrate using the conventional spin coating technique to a dry thickness of 5000 A. The substrate and resist was exposed to a projected light image at 4050 A. for one second and then developed using Cellosolve acetate as a solvent. The resulting developed image was sharp and showed excellent line definition (2.5 micron width). Similar exposures of the resist formulation B of Example 4 were made using the projection exposure system at a wavelength of 4050 A. for increasing periods of time. No image was formed even after an exposure for 100 seconds.

EXAMPLE 6

A resist formulation was made by dissolving 10.0 grams of polyvinyl cinnamate and 0.1 grams of the sensitizer 2,6 - bis(p-azidophenyl)-1,3,6,8-nonatetraene-5-one dissolved in 100 ml. of cyclohexanone. The resists were coated in a thickness of 1 micron by conventional spin coating technique and exposed using a projection apparatus which was a Mann Model 1595 Step and Repeat Camera at a wavelength of 4050 A. for 0.3 seconds. After development with a solvent comprising sharp images having excellent resolution were obtained.

It was found that an even greater speed increase could be obtained by heating the resist compositions to a maximum temperature at least 10° below the decomposition temperature of the sensitizer during the exposure of the resist.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A compound of the formula:

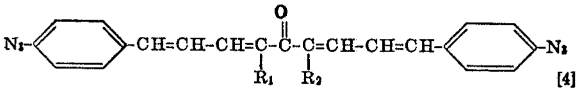

[4]

where $R_1$ is hydrogen or lower alkyl, where $R_2$ is hydrogen or lower alkyl, and where $R_1$ and $R_2$ may be joined to form a cycloalkyl ketone having 4 to 6 carbon atoms in the ring.

2. The compound 2,6-bis(p-azidocinnamylidene) cyclohexanone.

3. The compound 2,6-bis(p-azidocinnamylidene)-4-ylcyclohexanone.

4. The compound 1,9-bis(p-azidophenyl)-1,3,6,8-nonatetraene-5-one.

References Cited

FOREIGN PATENTS 892,811 3/1962 Great Britain.

JOHN M. FORD, Primary Examiner

U.S. Cl. X.R.

96—142